US012669558B2

(12) United States Patent (10) Patent No.: US 12,669,558 B2
Anderson et al. (45) Date of Patent: Jun. 30, 2026

(54) SELECTABLE MAGNETIC CONTACTLESS SWITCH

(71) Applicant: Sound Devices LLC, Reedsburg, WI (US)

(72) Inventors: Matt Anderson, Madison, WI (US); Jason McDonald, Madison, WI (US); Ed Judziewicz, Cambridge, WI (US)

(73) Assignee: Sound Devices LLC, Reedsburg, WI (US)

( * ) Notice: Subject to any disclaimer, the term of this patent is extended or adjusted under 35 U.S.C. 154(b) by 141 days.

(21) Appl. No.: 18/658,545

(22) Filed: May 8, 2024

(65) Prior Publication Data

US 2024/0377482 A1    Nov. 14, 2024

Related U.S. Application Data

(60) Provisional application No. 63/500,956, filed on May 9, 2023.

(51) Int. Cl.
*G01R 33/07* (2006.01)
*H04R 1/10* (2006.01)

(52) U.S. Cl.
CPC ......... *G01R 33/072* (2013.01); *H04R 1/1041* (2013.01); *H04R 2420/07* (2013.01)

(58) Field of Classification Search
CPC ........................ H04R 1/1041; H04R 2420/07
See application file for complete search history.

(56) References Cited

U.S. PATENT DOCUMENTS

| | | | |
|---|---|---|---|
| 3,258,544 A | 6/1966 | de Haan | |
| 5,471,658 A | 11/1995 | Iacono | |
| 6,867,680 B1 | 3/2005 | Kulle | |
| 8,963,535 B1 | 2/2015 | Melanson | |
| 9,465,087 B2 | 10/2016 | Klotzbuecher | |
| 11,852,901 B2 * | 12/2023 | Howell ................. | G02C 11/10 |
| 2005/0134257 A1 | 6/2005 | Etherington | |
| 2015/0100263 A1 | 4/2015 | Venzal | |
| 2018/0091887 A1 * | 3/2018 | Minoo ................ | H04R 1/1091 |
| 2020/0066470 A1 | 2/2020 | Mitchell | |

(Continued)

OTHER PUBLICATIONS

PCT/US2024/028378, International Search Report and Written Opinion dated Sep. 9, 2024, 13 pages.

(Continued)

*Primary Examiner* — Suhan Ni
(74) *Attorney, Agent, or Firm* — Andrus Intellectual Property Law, LLP

(57) ABSTRACT

An external selector assembly, such as a spring-loaded bayonet style switch, is removably attached to a compatible electronic device, such as a wireless microphone transmitter intended to be worn by a performer. A contactless magnetic interface has at least one signal magnet in the external selector assembly and an array of one or more Hall sensors within the device housing. If mounted on the compatible electrical device, the external selector assembly enables the user limited control without requiring any physical changes to the compatible electrical device except for the mounting of the external selector assembly. The external selector assembly and contactless magnetic interface are compatible with a sealed housing (e.g. sealed to prevent dust ingress and/or water).

16 Claims, 7 Drawing Sheets

(56)            References Cited

U.S. PATENT DOCUMENTS

| | | |
|---|---|---|
| 2020/0174558 A1 | 6/2020 | Gui |
| 2022/0159361 A1* | 5/2022 | LeBoeuf ............. A61B 5/6817 |
| 2023/0030946 A1 | 2/2023 | Warren |

OTHER PUBLICATIONS

"VLS Optical Speed Sensors With NPN Pulse or Analog Output", Shimpo, https://shimpoinstruemtns.com/product/VLS, accessed Apr. 23, 2024.
PCT/US2024/028378, International Preliminary Report on Patentability dated Nov. 20, 2025, 9 pages.

* cited by examiner

SELECTABLE MAGNETIC CONTACTLESS SWITCH

CROSS-REFERENCE TO RELATED APPLICATION

The present application claims priority of U.S. Provisional Patent Application No. 63/500,956, filed May 9, 2023, the content of which is incorporated herein by reference in its entirety.

FIELD OF THE INVENTION

The disclosed invention provides means to provide external control of electrical devices, such as wireless microphone transmitters, when operating in harsh or high stress environments. It provides a control switching mechanism wherein a configurable magnetic field penetrates a sealed outer casing for the device and activates an internal sensor to provide information regarding the position of the external switch. The device may be configured to accept a variety of switch types based on user preference without requiring any modification to the device in some embodiments.

BACKGROUND OF THE INVENTION

Portable, battery-operated audio instruments have become very popular over the last several decades. In audio visual production, it is often beneficial to provide performers with wireless equipment to free them from any concerns regarding entanglement or layout of cords while on set. In particular, providing wireless microphone transmitters wireless microphone transmitter can offer significant benefits along these lines. The use of these devices (supporting equipment) is often complicated by the fact that they are required to function in a variety of environments. These may involve the presence of water, dust, dirt and/or mud due to the seemingly endless variety of environments that studio or film sets may need to include. Some of the most extreme examples are those likely to be performed by stunt professionals, where such equipment must provide reliable operation despite the potential presence of fire, chemicals, dirt and exceptionally rough handling. For this reason, designers strive to make supporting equipment as simple to operate and robust as possible. Along these lines, a wireless microphone transmitter worn by a performer should be configured to operate as simply as possible and is preferably housed in a water-tight sealed housing.

Ideally, the user interaction with the functioning of a wireless microphone transmitter should be kept as minimal as possible so as to allow performers to more completely concentrate on their performance roles, rather than needing to worry about the condition or state of any supporting equipment. For example, it may be desirable that the user need only control mute, talkback or power on/off features, if any are provided at all. In some cases, it may be preferable to completely remove any interaction between the performer (wearer) and a wireless microphone transmitter by not having any controls available. In particular, the desire to produce a portable body-pack wireless microphone transmitter having these capabilities motivated the inventors to create the preferred embodiments of the present invented as described in this disclosure. In the preferred embodiment, user information is carried into a wireless microphone transmitter using one or more interchangeable switches, each connected to internally movable magnets that are coupled to a Hall sensor array contained within a sealed electrical device (such as a wireless microphone transmitter) to allow the device to collect control information relating to the chosen switch settings. In the context of this disclosure, the word "array" when applied to a collection of Hall sensors should not be taken as being limited to embodiments where more than a single Hall sensor is used. For example, in many preferred embodiments, only a single Hall sensor may be required. For these embodiments, the Hall sensor array (or Hall sensor) may be referred to as a "single element Hall sensor array". The number of Hall sensors in a Hall sensor array need not always correspond to the same number of signaling positions from one or more signaling magnets. In some embodiments, it may be preferable for a switch to only signal a subset of the Hall sensors present in an array. In this way, the flexibility for users to choose a switch from a larger selection of configurations may be enhanced.

DESCRIPTION OF THE PRIOR ART

Hall Effect sensors (or "Hall sensors") produce a small measurable voltage when introduced into the proximity of a magnetic field based on the Hall principle. This phenomenon has been known since the late 19th century and is frequently used in applications where the internal position of some device is required. For example, in brushless DC motors (BLDC motors), Hall sensors are commonly employed to determine rotor position in controlling motor commutation. Another more recent example can be found in U.S. patent publication US 2005/01342.57 A1 by Etherington et al, wherein a user may manually control an electronic device where the output from a Hall sensor may act as a sensor or a switch. It is worth noting that other relevant sources for related prior art are also disclosed by the Etherington patent. While using a Hall sensor for controlling a switch is well-known in the art, Etherington discloses a clutch pedal arrangement where a Hall sensor may be applied to sense whether a clutch has been engaged. In an exemplary embodiment of this invention as applied to the specific case of a wireless microphone transmitter, users (such as star performers) wearing these devices may be expected to efficiently operate them in the midst of working with high expectations in place for their performance. This may understandably place them under a significant level of pressure (or work-related stress) while performing. For this reason, it is valuable to keep the required interaction between the performer and wireless microphone transmitter (through a control interface) as simple as possible and in a capacity that is familiar, comfortable and easy to understand for the performer. Generally speaking, the preferred control interface is likely to vary from one performer to the next, depending on their training, personal experience and preferences.

SUMMARY OF THE INVENTION

The invention pertains primarily to the use of a Hall switch to provide simple control of a wireless microphone transmitter adapted to be worn by a performer. The wireless microphone transmitter has an array of one or more Hall sensors mounted within the housing. The one or more Hall sensors provide a signal to the processor or microcontroller in the wireless microphone transmitter when an external magnet is brought with threshold vicinity of the Hall sensor. An external selector assembly, e.g., a spring-loaded bayonet switch or another kind of mechanical switch, is removably attached to the housing of the wireless microphone transmitter. Manipulation of the external switch by the performer moves the position of an external signal magnet to move the magnet relative to the one or more Hall sensors contained within the transmitter housing. The Hall sensor outputs a signal when the signal magnet is brought into proximity of the respective Hall sensor, and that signal is received directly or indirectly by the processor or microcontroller on the wireless microphone transmitter. The term processor is used broadly to also include devices considered to be microcontrollers, or microprocessors, and other processing means suitable for operating a wireless microphone transmitter.

The preferred external switch is a spring-loaded bayonet-style switch that can be removably attached to the top surface of the wireless microphone transmitter. The preferred spring-loaded bayonet-style switch includes two positions. A locked position of the spring-loaded bayonet-style switch positions the signal magnet within range to activate a Hall sensor located within the transmitter housing. The free position of the spring-loaded bayonet-style switch positions the signal magnet outside of the range of activation of the Hall sensor. In this way, the performer can conveniently move the switch between the two positions, which provide positive tactile feedback so that the user does not have to look down. Also, there is little chance of the switch being displaced involuntarily because the bayonet profile is low, and the spring force holds the switch in the selected position.

Of course, the wireless microphone transmitter must be a compatible electrical device, namely, the wireless microphone transmitter must have one or more Hall sensors located within its housing in locations compatible with the positioning of the signal magnet(s) on the removable switch when it is mounted its housing. The processor in the wireless microphone transmitter must also be programmed or set to respond appropriately to the Hall sensor signals. It is preferred that wireless microphone transmitter is programmable to enable the user to select which transmitter functions or function are controlled by the Hall sensor signals. For example, in one embodiment of the invention the user can program whether the external switch is set to toggle RF on/off, mute, record or power on/off.

Accordingly, all electronics for the wireless microphone transmitter including the Hall switch are in the transmitter housing. If desired, a variety of external contactless (magnet) switch configurations can be provided for attaching to the transmitter housing, in the event that certain users or performers have unique or complex needs. No external electrical connectors are required on the transmitter to mate with the switch or selector. The invention facilitates the use of the wireless microphone transmitter being in a sealed enclosure because the switch does not require that any external electrical contacts be available outside of the housing.

It is contemplated to provide performers with the means to adjust or control the functions of mute, talkback, power on/off, along with any other selectable function(s) with their choice of an attachable switch.

It is also contemplated that the invention may be used in connection with other portable audio devices. For example, the compatible electrical device can be a portable audio device other than a wireless RF microphone transmitter, such as a portable RF receiver, recorder, mixer, mixer-recorder, fader, microphone pre-amplifier, data format converter, back link communication device, sound enhancement devices, headphone distribution amplifier or portable microphone.

BRIEF DESCRIPTION OF THE DRAWINGS

FIG. 6A shows the bayonet style switch in a locked position with a magnet in the switch being closest to a Hall sensor in a wireless microphone transmitter to with the switch is mounted. FIG. 6B shows the bayonet style switch in a free position with the magnet in the switch being farthest from the Hall sensor in a wireless microphone transmitter to with the switch is mounted.

DETAILED DESCRIPTION OF THE INVENTION

Figure 1A:
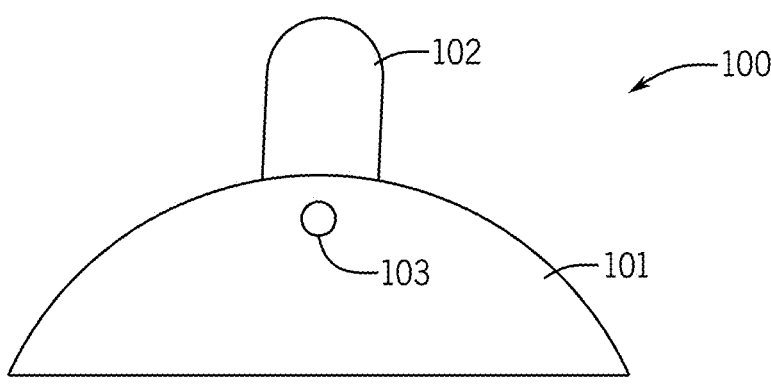
FIGS. 1A-C are orthographic views of a first exemplary embodiment of the invention wherein a vertical toggle switch is designed to interface to a contactless magnetic interface of an electrical device such as a wireless microphone transmitter.
Figure 1B:
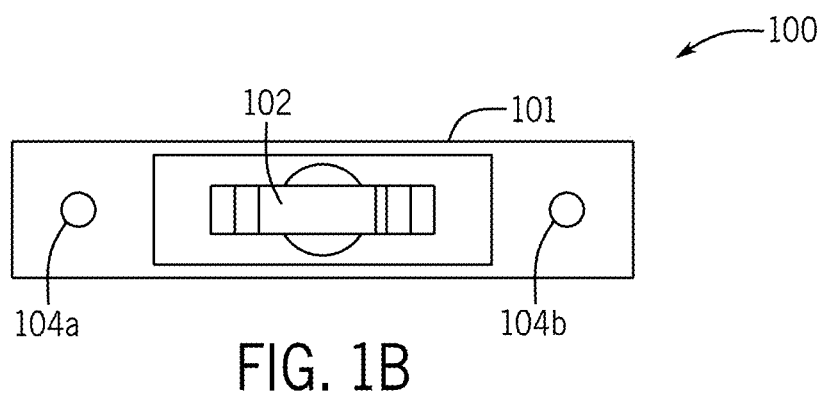
Figure 1C:
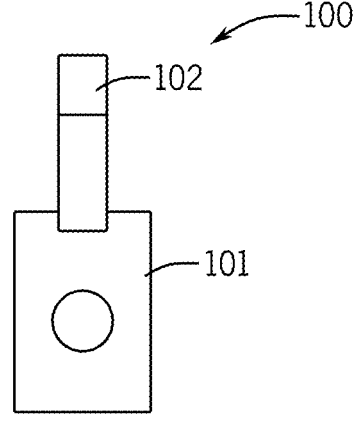

FIGS. 1A-C and 2 show a magnetically coupled vertical switch 100 that may be attached to a compatible electrical device 200 for inputting control information in accordance with a first embodiment of the invention. In the exemplary embodiments of the invention, the compatible electronic device 200 is a wireless microphone transmitter designed to be worn as a body pack on a performer. The application of this embodiment assumes the electrical device 200 is constructed with a compatible mounting interface (e.g., threaded holes 205a, 205b in device housing 201) and an "embedded array" of Hall sensors 204a and 204b contained within the device housing 201 and located under the surface of the device housing 201. The Hall sensors 204a, 204b are preferably configured so that electronic hardware such as a processor 207 within the electrical device 200 is able to read the status of the Hall sensors 204a, 204b to extract information regarding the position of the toggle 102 on the switch

100. The switch 100 may be mounted to the surface of the compatible electronic device 200 shown in FIG. 2 using fasteners. For this embodiment, a pair of threaded fasteners (bolts or screws) is used, where a first fastener is passed into (and through) the switch housing 101 at openings 104a and 104b, threading (and firmly attaching it) into threaded holes 205a and 205b that are built into the housing 201 of the electronic device 200. Other embodiments such as those requiring only a single (or three or more) fasteners are envisioned by this disclosure. Finally, other means of fastening the switch 100 to a compatible electronic device 200, such as by magnetic attraction, glue, taping, Velcro, latches, bolts or flexible (Snap-On) clips (made of vinyl or other suitable material) are also envisioned by this disclosure.

Figure 2:
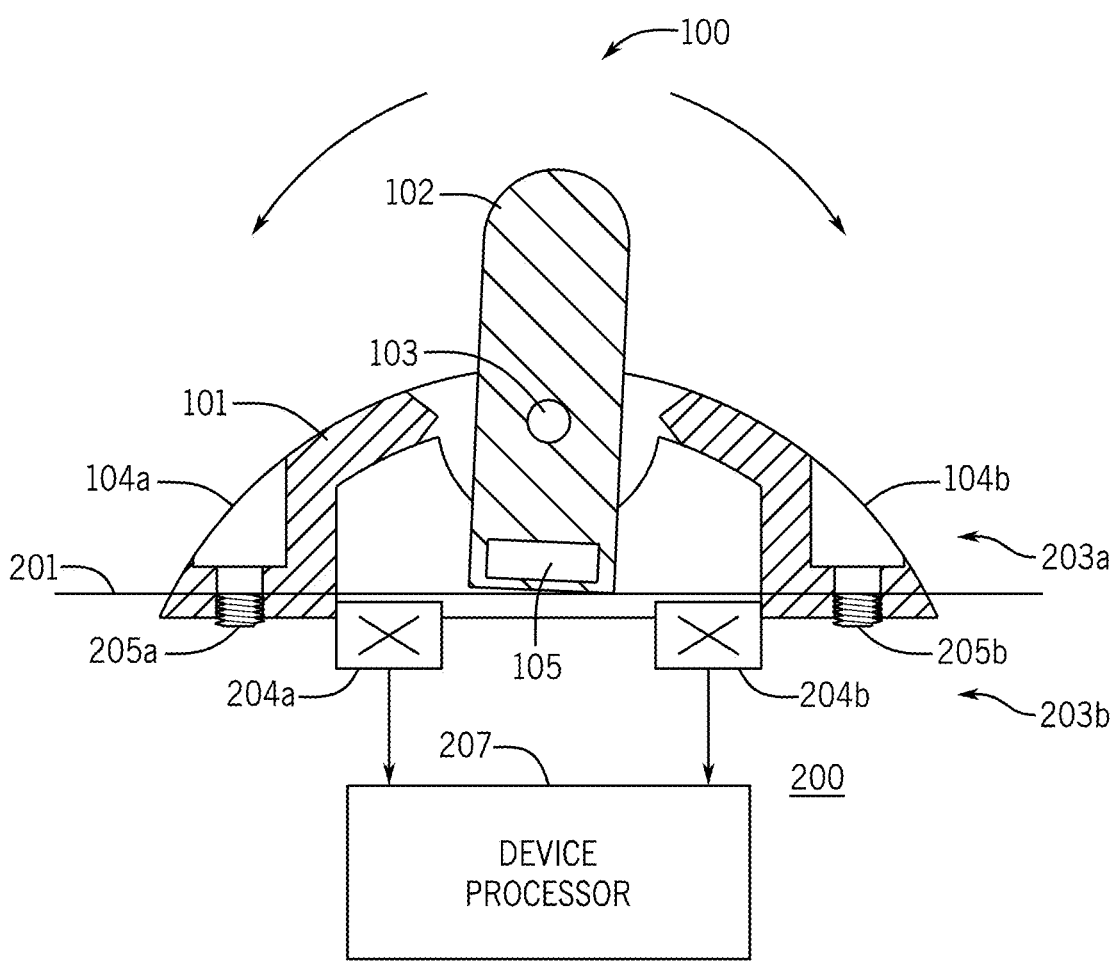
FIG. 2 is a vertical cross-section view of the switch in FIGS. 1A-C mounted to an electrical device such as a wireless microphone transmitter, showing internal components of the switch interacting with Hall sensors contained within the housing for the wireless microphone transmitter.

The switch toggle (or lever) assembly 100 is located to the exterior 203a of the compatible electrical device 200 (e.g. wireless microphone transmitter) and is mounted to mate to the device housing 201, such that the toggle 102 swings in a plane normal (perpendicular) to the orientation of the external surface of the device housing 201. In FIG. 2, the switch 100 is mounted on a sidewall of the device housing 201, with the upward direction being to the right in FIG. 2. The device housing 201 may be constructed of metal, plastic or any other material that will allow the passage of a magnetic field through it to the embedded Hall sensor array 204a and 204b. The toggle 102 may be internally supported on a hinge pin (or pivoting mount) 103 located within a switch housing 101 such that a user may pivot the top of the toggle 102 in either an upward or downward direction as indicated by the two (upward and downward) directional arrows in FIG. 2. The length of the toggle 102 internally extends past the hinge pin 103 towards the device 200 with a signal magnet 105 mounted at the endpoint of the toggle 102. For example, since the hinge pin 103 allows rotation of the toggle 102 about the center of the hinge pin 103, if a user manually swings the external portion for the toggle 102 in the upward direction (to the right in FIG. 2), the signal magnet 105 at the other (internal) end of toggle 102 will internally swing in the opposite direction, moving the signal magnet 105 closer to the lower Hall sensor 204a mounted adjacent the internal surface of the device housing 201. As the signal magnet 105 is moved closer to the lower Hall sensor 204a in the device interior 203b, at some point, the magnetic field from the signal magnet 105 activates the lower Hall sensor 204a such that a processor 207 in the device may read the status of the Hall sensor array 204 *a,b* and determine the user has provided an input corresponding to an upward toggle 102 movement.

In a manner analogous to that just described, if a user moves the toggle lever 102 in a downward direction (to the left in FIG. 2), the toggle movement will cause the signal magnet 105 to move upward and come into closer proximity with the high Hall sensor 204b, activating it. Again, the processor 207 in the electronic device 200 may read the status of the Hall sensor array 204a,b and determine the user has provided an input corresponding to a downward toggle 102 movement. Accordingly, the switch 100 can detect three positions (up, down, neutral) with two Hall sensors within the hosing of the compatible electrical device.

Figure 3A:
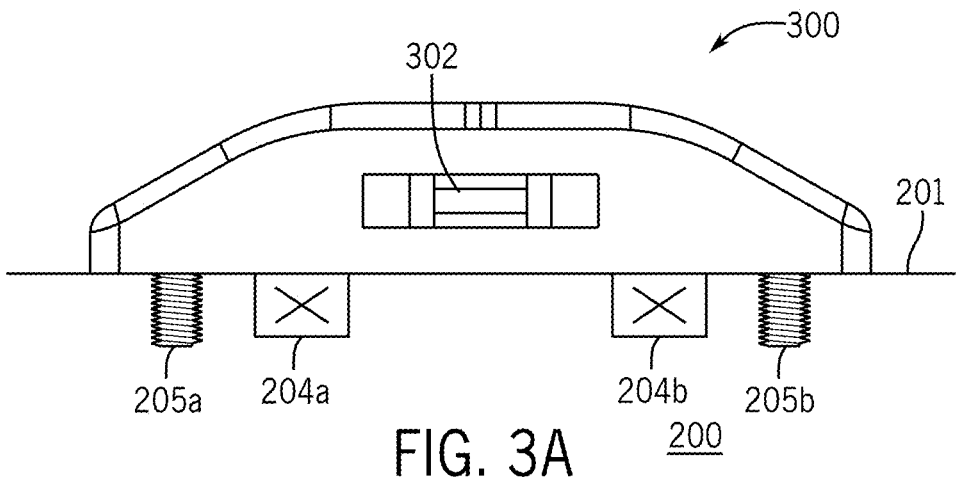
FIGS. 3A-C are orthographic views of a second exemplary embodiment of the invention wherein a right-angle toggle switch is designed to interface to a contactless magnetic interface of an electrical device such as a wireless microphone transmitter, wherein the device is configured to accept either a vertically or right-angle oriented switch, without modification.
Figure 3B:
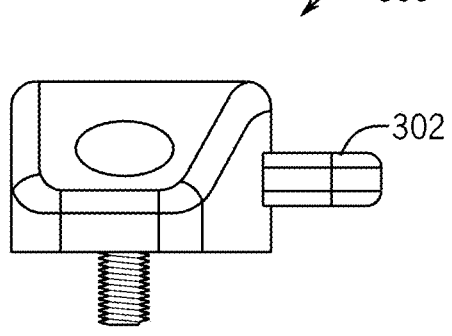
Figure 3C:
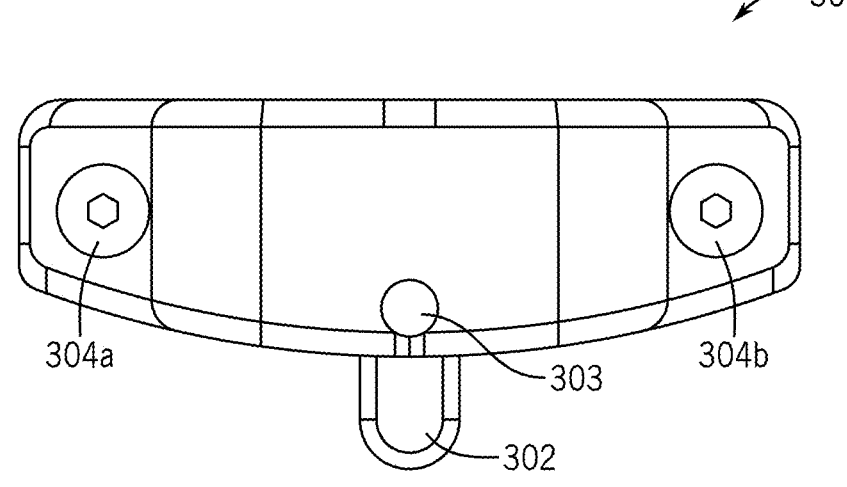
Figure 4:
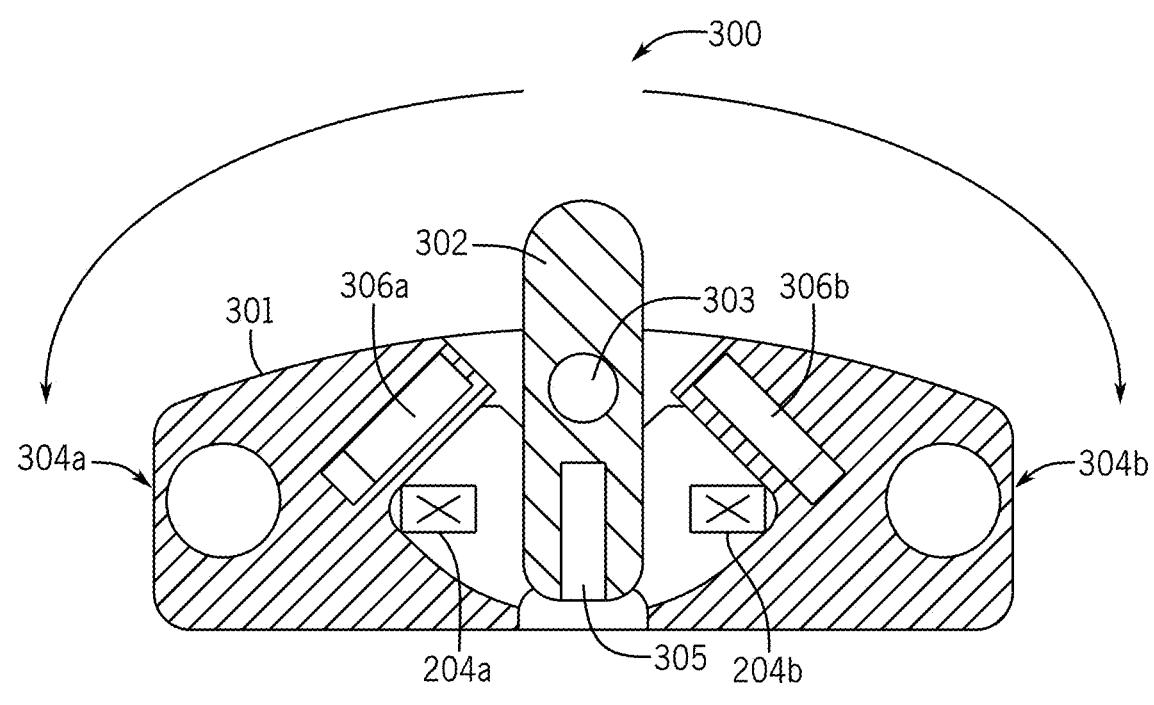
FIG. 4 shows a sectional view of the switch in FIGS. 3A-C, illustrating internal components of the switch with a view taken from a horizontal slice extending longitudinally through the interior of the switch.

FIGS. 3A-C are orthographic views of a right-angle toggle switch 300 constructed in accordance with another exemplary embodiment of the invention that operates in many ways similar to the vertical switch 100 of FIGS. 1A-C and 2. A depiction for the device housing surface 201 is included in FIG. 3A to illustrate how the right-angle switch lays on its side against the housing surface 201 when attached by screws in threaded holes 205a and 205b. FIG. 4 is a cross sectional view of the right-angle toggle switch 300 shown in FIGS. 3A-C taken along line B-B in FIG. 3A, which provides a view of the internal components of the right-angle switch 300. This particular embodiment differs from that of FIGS. 1A-C and 2 in that the toggle 302 is oriented at a right angle compared to the toggle 102 of FIGS. 1A-C and 2. In this sense, a user operates (moves) the toggle 302 along a plane that is parallel to the outer surface of the device housing 201. As such, it is referred to as a "right angle" switch because the axis of the hinge pin 303 lies along a line that forms a right angle to the surface of the device housing 201. Ideally, the size and spacing for the mounting holes 304a and 304b are of similar size and spacing as the mounting holes 104a, b in the vertical switch 100. In this sense, a mounted vertical switch 100 may be removed and replaced with the mounting of a right-angle switch 300, depending on the preferences of a user without the need for any changes to be made to the electrical device housing 201 when swapping one contactless magnetic switch type (i.e. vertical versus right-angle) for another.

Referring to FIG. 4, when a user moves the toggle 302 in FIG. 4 in the forward direction, since the toggle 302 rotates on the hinge pin 303, the lower end of the toggle 302 holding the signal magnet 305 will move in the backward direction toward the rear Hall sensor 204a. It is worth noting in FIG. 4 that the forward and rear Hall sensors 204b and 204a, respectively are preferably mounted directly underneath the device housing surface 201 as shown in FIG. 3A such that when the signal magnet 305 is brought into proximity to either of them by movement of the toggle 302, the magnetic field for the signal magnet 305 will penetrate the device housing surface 201 to activate the adjacent sensor (204a or 204b). At this time, a processor (e.g. like processor 207 in FIG. 2) in the compatible electronic device connected to the Hall sensors 204a and 204b may read a change in the status for the output of the rear Hall sensor 204a and determine that a forward toggle control input has taken place and execute the corresponding control function for the device.

In a likewise manner, if a user moves the toggle 302 in the backward direction, this action causes the signal magnet 305 to move in the forward direction in closer proximity to the forward Hall sensor 204b, that may signal to a processor in the device 207 that such a rear toggle control input has taken place.

In addition to the signal magnet 305, two additional optional detent magnets 306a and 306b are included in the design of FIG. 4. In some embodiments, these may be configured to attract the signal magnet 305, such that when a user flips the toggle into the fully forward position, detent magnet 306a will hold onto the signal magnet 305, holding the toggle 302 in this position until a user moves it again. Likewise, detent magnet 306b may be used to hold the toggle 302 in the fully backward direction, if configured to attract the signal magnet 305. In other embodiments, detent magnets may be configured to repel the signal magnet 305, in which case, the toggle will return to a stable center position after being toggled to either the forward or backward positions. In yet other embodiments, a spring loading system (with a spring possibly wound around the hinge pin 303) may be used to provide detent positions for either the center position or the fully forward or fully backward ends for the travel of the toggle lever 302.

In a like manner, a spring or magnet driven detent could be built into the vertical switch 100 of FIG. 2.

Figure 5:
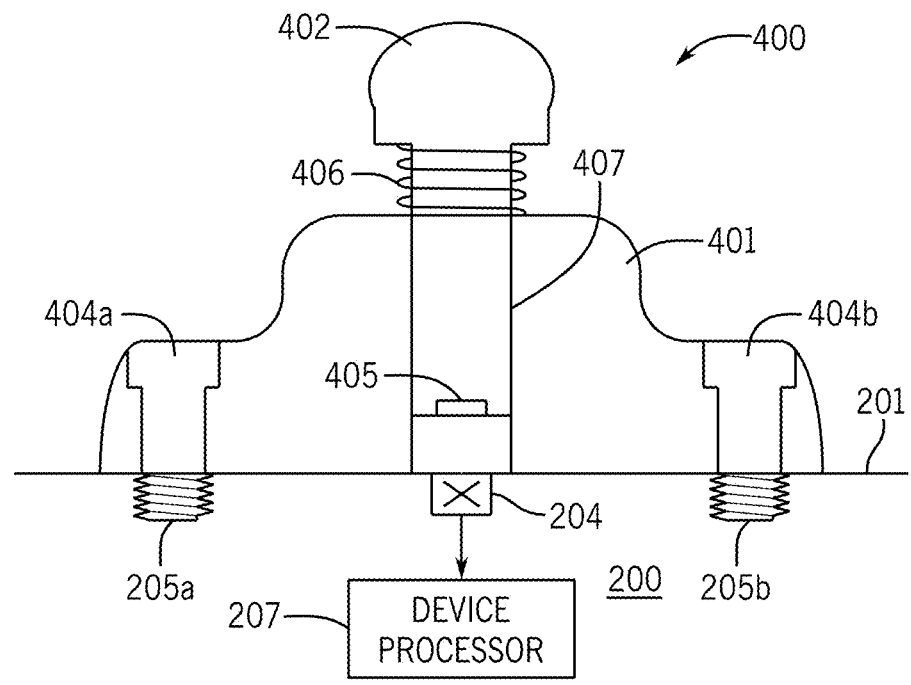
FIG. 5 illustrates internal components for a third exemplary embodiment for the invention implementing a simplified push button, where a vertical cross sectional view is taken from a vertical slice extending longitudinally through the interior of the switch.

As yet another example that the present invention can embody, FIG. 5 shows an embodiment of the invention 400 where a control command is provided as an input to the processor 207 of a compatible electrical device 200 based on the simplicity of a push-button switch 400. Two switch mounting holes 404*a* and 404*b* are provided in the switch housing 401 and are spaced corresponding to threaded holes 205*a* and 205*b* in the compatible electrical device 200, following a similar pattern to the other embodiments described earlier but with the push button switch 400 shown in FIG. 5. The push button switch 400 may be installed in place (at the same mounting location) of the vertical switch of FIGS. 1A-C and 2 or in place of the horizontal switch of FIGS. 3A-C and 4. In this embodiment, only a single Hall sensor 404 is required, as defined earlier, a "single element sensor array" embedded just under the enclosure housing 201 of the compatible electrical device 200. In this embodiment, a return spring 406 normally holds a button head 402 and an attached button stem 407 in an upward position such that a signal magnet 405 embedded in the push button stem 407 is positioned to provide sufficient distance between it and an embedded Hall sensor 204 so the Hall sensor 204 will not be activated. However, when a user presses the button head 402 down towards the enclosure housing 201, the Hall sensor 204 may be brought into close enough proximity such that the Hall sensor 404 is activated. At this time, the device processor 207 reads the status of the Hall sensor 204 and determines that a user has pressed the push-button switch 400 to activate a corresponding function for the compatible electrical device 200. In other embodiments for a push-button switch, a latch-in, latch-out mechanism may be included such that when a user presses the button head 402, the switch remains at a latched-in position (with the Hall sensor 204 held active). From this state, after a subsequent press of the button head 402, the switch may then return to a latched-out position (with the Hall sensor 204 remaining inactive).

It should now be apparent to those skilled in the art that a compatible electrical device having an enclosure or housing incorporating a set of threaded attachment points (e.g., 205*a* and 205*b* in FIG. 2) and an internal Hall sensor or array Hall sensors may accept the attachment of a suitable switch or control device, provided it contains a compatible set of attachment points and a moveable signaling magnet that correspondingly activates elements from the internal Hall sensor array, without the need for any modifications to the device, allowing signaling control inputs to be provided to the device.

One important advantage of the disclosed invention is that the attachment points on the device enclosure and internal Hall sensor array do not require any open access (holes) between the interior 203*b* and exterior 203*a* of the device housing. This allows for watertight and/or environmentally (air, gas, liquid, dust or chemicals) sealed housings.

Figures 6A, 6B, 7:
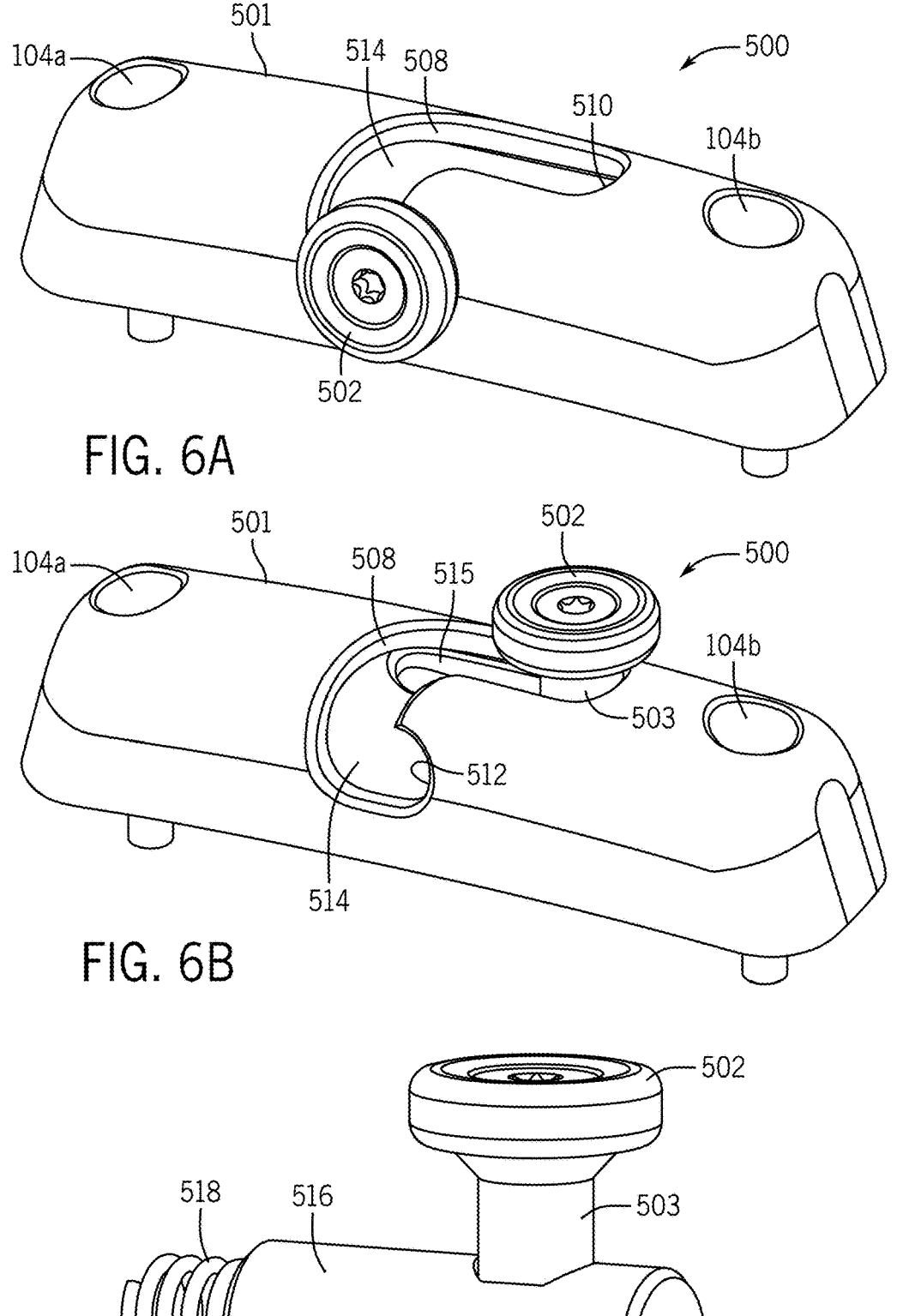
FIGS. 6A and 6B show a removable, spring-loaded bayonet style magnetic switch constructed in accordance with a fourth exemplary embodiment of the invention.
FIG. 7 is a view illustrating some components inside the housing of the spring-loaded bayonet style magnetic switch shown in FIGS. 6A and 6B, and a Hall sensor intended to be mounted within the compatible wireless microphone transmitter.

FIGS. 6A and 6B show a removable, spring-loaded bayonet style magnetic switch 500 constructed in accordance with a fourth exemplary embodiment of the invention. FIG. 6A shows the bayonet style switch 500 in a locked position with a magnet 505 in the switch 500 being closest to a Hall sensor 204 in the wireless microphone transmitter 200 when the switch 500 is mounted to the transmitter 200. FIG. 6B shows the bayonet style switch 500 in a free position with the magnet 505 in the switch being farthest from the Hall sensor 204 in the wireless microphone transmitter 200 to with the switch 500 is mounted. The housing 501 includes a bayonet channel 508 with a seat 510 for the free position and a seat 512 for the locked position. A tubular sleeve 514 is located inside the housing 501 and is able to rotate along its longitudinal axis. The tubular sleeve 514 has a longitudinal slot 515 through which the stem of 503 of the button

502 passes and is allowed to move longitudinally. FIG. 7 shows a trunnion cylinder 516 to which the button 502 and the stem 503 are connected. The signaling magnet 505 is mounted within an opening in the trunnion cylinder 516 so that the magnet 505 can be brought into close proximity of the Hall senor 204 mounted with the transmitter housing 201. A spring 518 is provided to provide a spring bias force for the stem 503 against the seat 510 for the free position (FIG. 6B) or the seat 512 for the locked position (FIG. 6A). The sleeve 514 holds the spring 518 against the tubular trunnion 516 and otherwise provides dynamic structural support to the switch 500. To move the button 502 and the signaling magnet 505 from the free position (FIG. 6B) to the locked position (FIG. 6A), the performer pushes the button 502 longitudinally against the spring force to the end slot 515 in the sleeve 514, rotates the button 502 downward and releases the button 502 so the spring force pushes the stem 503 against the seat 512 in the bayonet channel 508 of the housing 501. To move the button 502 and the signaling magnet 505 from the locked position (FIG. 6A) to the free position (FIG. 6B), the performer pushes the button 502 longitudinally against the spring force again to the end slot 515 in the sleeve 514, rotates the button 502 upward and releases the button 502 so the spring force pushes the stem 503 against the seat 510 in the bayonet channel 508 of the housing 501.

Figures 8A, 8B, 8C:
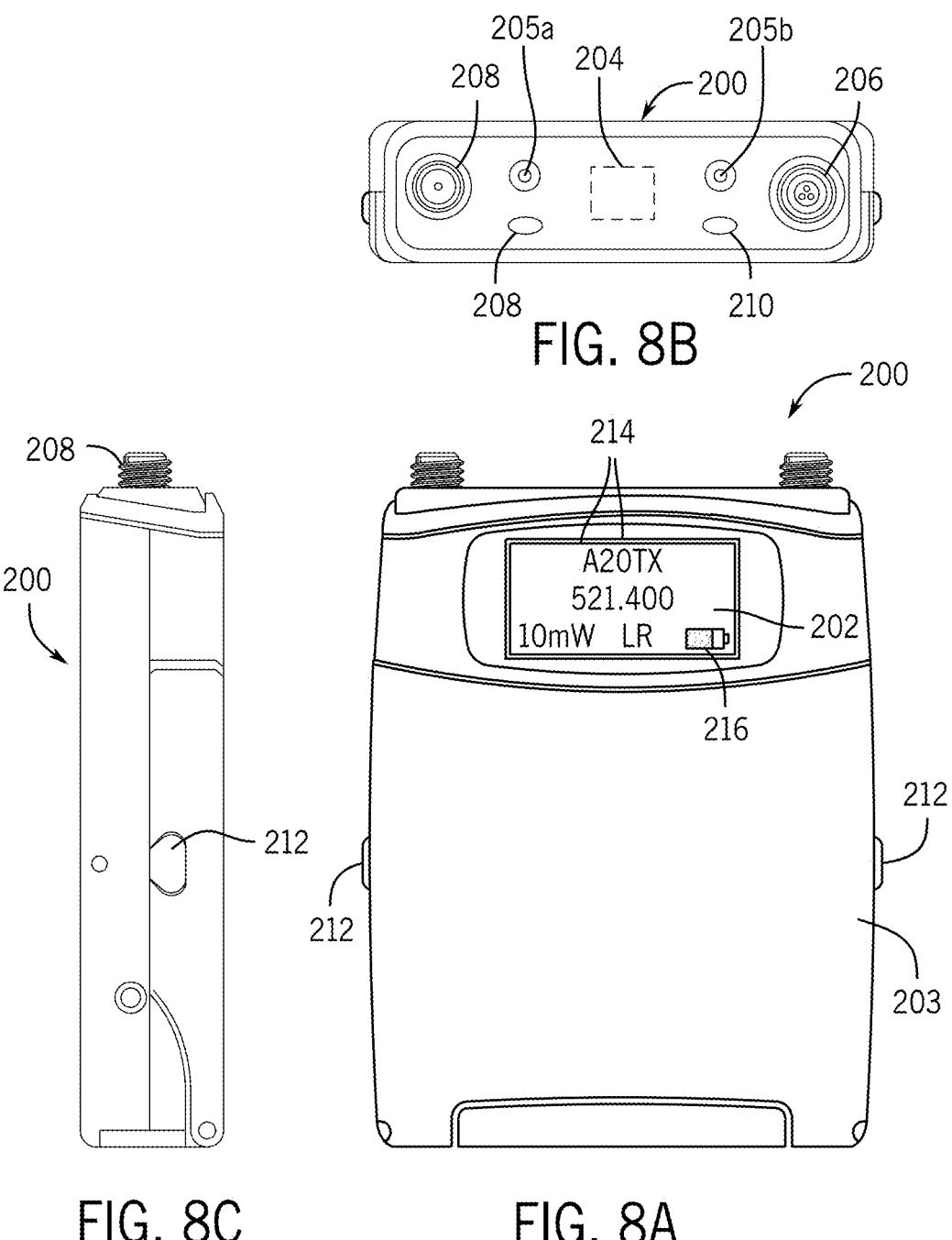
FIGS. 8A-8C show a wireless microphone transmitter to which the removable switch in FIGS. 6A and 6B can be mounted.

FIGS. 8A-C and 9 illustrate an exemplary wireless microphone transmitter 200 having an e-paper display 202. The assignee of this application, Sound Devices, LLC manufacturers digital wireless RF transmitters, and the illustrated transmitter 200 is sold under the product name A20-TX. The wireless microphone transmitter 200 collects signals from a microphone or a guitar pick up and is designed to be worn by a performer (e.g. body pack) although it can be mounted in other locations as well. The wireless microphone transmitter 200 wirelessly transmits audio data via RF signal to a wireless RF receiver. Since the wireless microphone transmitter 200 is typically intended to be worn by the user, the transmitter 200 uses batteries, removing the requirement for any power cords. The wireless microphone transmitter 200 can use single use batteries or rechargeable batteries. As can be seen in FIG. 8A, the wireless microphone transmitter 200 includes a display 202 mounted in the upper part of the unit. The transmitter 200 also includes a battery bay door 203 (shown as closed in this view) attached to the front of the unit. The top surface of the wireless microphone transmitter 201 includes an antenna connector 208, and a multipurpose audio input port 206, which is capable of connecting to various microphones and guitar pick up devices. The wireless microphone transmitter 200 also desirably includes a power status LED 208 and an operational mode status LED 210 (mute, record, pairing, transmitting, time code syncing) on its top surface, FIG. 8B. Pressure releasable latches 212 are provided to latch the battery bay door 203 in the closed position. LED lights 214 are mounted adjacent to the display 202 and can be activated to shine on the display 202 to facilitate viewing in dark environments. With the battery bay door 203 closed, a home screen is displayed on display 202. The home screen includes information deemed pertinent when operating the wireless microphone transmitter 201, including a power or battery status icon 216.

The top surface of the wireless microphone transmitter 200 also includes threaded mounting holes 205*a*, 205*b* for a removable Hall switch like those describe above, and preferably similar to removable switch 500 described in FIGS. 6A-B and 7. The mounting holes 205*a*, 205*b* are sealed, however, it still may be desirable to keep screws in the holes 205*a*, 205*b* even when a switch (e.g. 100, 300, 400 or 500 is not mounted to the transmitter 200.

Figure 9:
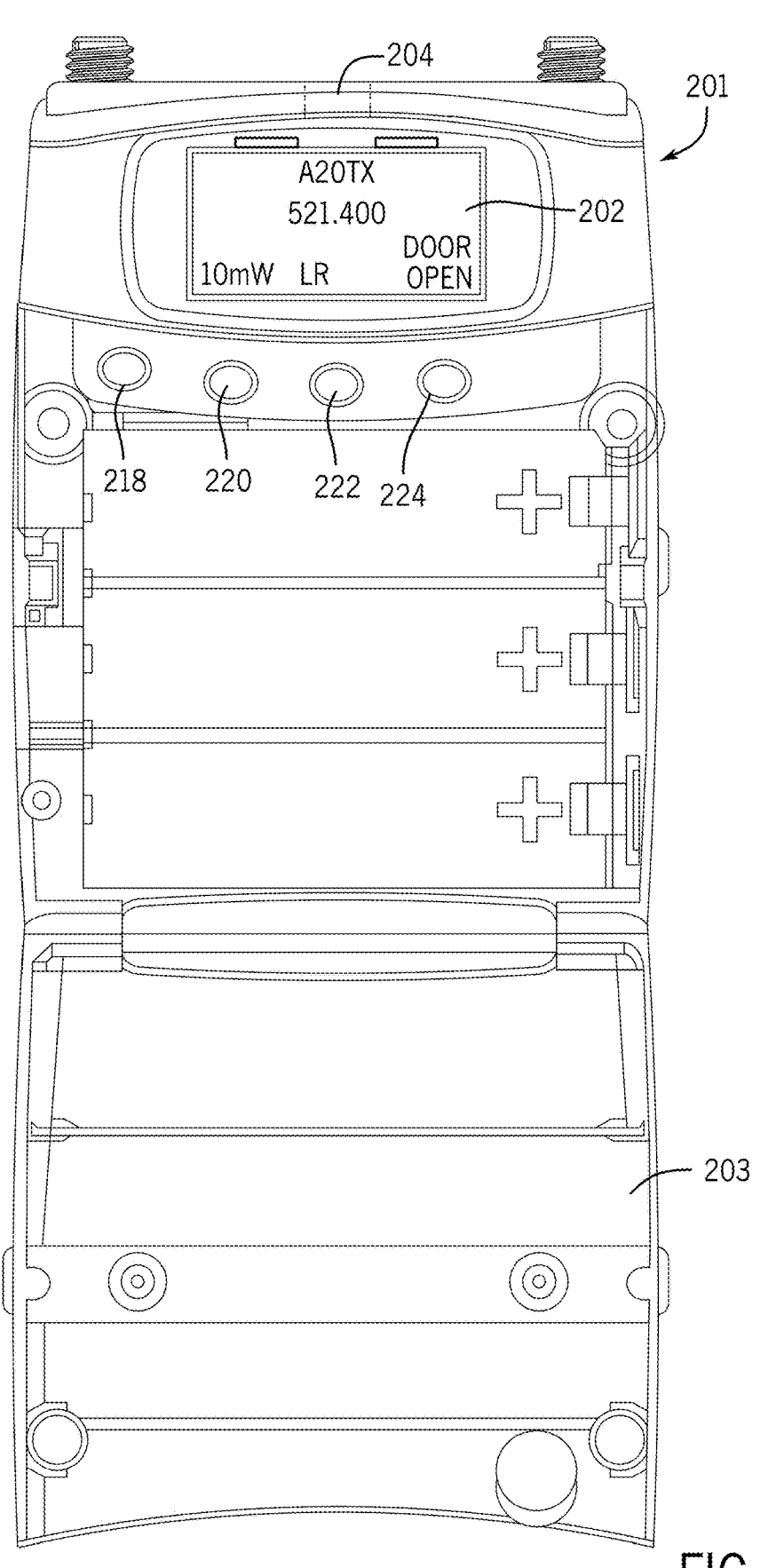
FIG. 9 is a front assembly view of the wireless microphone transmitter shown in FIGS. 8A-8C, showing a battery bay inside an opened battery bay door with programming buttons exposed to the user.

FIG. 9 shows the wireless microphone transmitter 200 from the front of the unit 200 with the battery bay door 203 flipped down into an open position, which allows access to the battery bay for removal and/or replacement of the batteries. With the door 203 open, buttons 218, 220 222 and 224 are exposed for the user to navigate and program the wireless microphone transmitter 200. Button 218 is a power on/off button. Buttons 220, 222, 224 are for navigating menus and setting and selecting values on the programmable interface. In this example, the battery bay accepts 3 batteries with one battery assigned to each docking slot.

A Hall sensor 204 is mounted inside the housing of the wireless microphone transmitter 200 facing the top surface of the housing shown in FIG. 8B. The Hall sensor 204 is shown in phantom in FIG. 8B and in FIG. 9. The location of the magnet 505 in switch 500 determines whether the Hall sensor 204 is activated. By connecting the microprocessor in the wireless microphone transmitter 200 to the Hall sensor 204, the microprocessor can monitor the status of the removable switch 500 if it is mounted to the transmitter 200. If at any time a user pushes the switch 500 to the locked position, FIG. 6A, the software in the microprocessor receives a positive signal and controls the transmitter 200 accordingly. For example, the transmitter 200 can be programmed so that the positions of the latching bayonet-style switch can be assigned to one of the following functions: power, record, mute, transmit RF data. If the switch function is programmed to power, then the user can use the switch 500 to turn the transmitter 200 off without having to open the battery bay door 203. The location of the bayonet-style switch 500 on the top surface is especially convenient for performers and the two-position spring loaded latch mechanism is simple to use and not distracting to operate.

A suitable Hall sensor 204 is a tri-axis Hall sensor with a programmable threshold, such as an ultra-small, tri-axis magnetic smart switch manufactured by Asaho Kasci Microdevices (AKM), Tokyo Japan, although only 1 axis (x-direction) needs to be utilized. The Hall sensor 204 is programmed such that when a magnet slides from one side of the switch 500 to the other side, the magnetic field strength and/or direction changes enough to cross the programmed threshold. When this occurs, an interrupt fires which triggers the microcontroller/device processor 207. The Hall sensor 204 is located below the switch 500, halfway between the linear travel of the switch actuator (which contains the magnet). The Hall sensor output is digital, using the threshold described above. Internally to the Hall sensor circuit, it is of course by nature analog.

The device processor 207 is kept in an extremely low-power state drawing a few microamps of current when the wireless microphone transmitter 200 is turned off. The power draw in the off state is lower than the leakage current of a typical battery. Accordingly, the Hall sensor 204 has a low level of power available when the transmitter 200 is turned off. When the switch 500 is moved and the magnetic threshold in the Hall sensor 204 is exceeded, the interrupt to the microcontroller 207 is set low. The microcontroller 207 sees the interrupt and executes code to fully power up the unit.

Notwithstanding the multiple configurations switches that are shown and described, other switch configurations for a control input device are contemplated and considered within the scope of the present disclosure. For example, the inventors have contemplated embedding a linear array of Hall sensors under the surface of the device housing, where a moveable (sliding) signal magnet may be moved along this array to signal a variety of inputs. In some embodiments, the Hall sensor array may span a linear straight line, or in other embodiments, they may span an arbitrary curved line, be arrayed in a circle (facilitating a knob control) or any other pattern, requiring only that one or more input signal magnets are configured to achieve proximity to sufficiently activate Hall sensors from this array when nominally used. In some embodiments, the use of multiple signal magnets may be desired. In yet other embodiments, the ability for a signal magnet to reach (and activate) all Hall sensors in an embedded array may not be required, as activating a subset of them may provide enough input control information.

The invention has been describe primarily in connection with the compatible electrical device being a wireless microphone transmitter, however it is contemplated that the invention be used in connection with other portable audio devices, such as portable RF receivers, recorders, mixers, mixer-recorders, faders, microphone pre-amplifiers, data format converters, back link communication devices, sound enhancement devices, headphone distribution amplifiers or portable microphones.

The invention claimed is:

1. A wireless audio system comprising:
   a wireless microphone transmitter adapted to be worn by a performer, said wireless microphone transmitter having a housing, an array of one or more Hall sensors contained within the housing, and a processor; and
   an external selector assembly removably attached to the housing of the wireless microphone transmitter including at least one signal magnet that is located external to the housing and is movable relative to the one or more Hall sensors contained within the housing in response to manipulation of the external selector assembly outside of the housing;
   wherein each Hall sensor outputs a signal when one of the signal magnets is brought into proximity of the respective Hall sensor, and that signal is received directly or indirectly by said processor on the wireless microphone transmitter; and further
   wherein the external selector assembly removably attached to the housing of the wireless microphone transmitter is a spring-loaded bayonet-style switch.

2. The wireless audio system recited in claim 1 wherein the spring-loaded bayonet-style switch is removably attached to a top surface of the wireless microphone transmitter.

3. The wireless audio system recited in claim 1 wherein the spring-loaded bayonet-style switch includes a single signal magnet and two switch positions, the array of one or more Hall sensors contained within the housing consist of a single Hall sensor for the switch, and a locked position of the spring-loaded bayonet-style switch positions the signal magnet within range to activate the single Hall sensor and a free position of the spring-loaded bayonet-style switch positions the signal magnet out of range to activate the single Hall sensor.

4. The wireless audio system recited in claim 3 wherein the spring-loaded bayonet-style switch provides means to externally adjust or control the functions of mute, talkback, and/or power on/off, record or transmit.

5. The wireless audio system recited in claim 4 wherein the wireless microphone transmitter can be programmed to select the function that the spring-loaded bayonet-style switch is able to adjust or control.

6. The wireless audio system recited in claim 1 wherein the housing of the wireless microphone transmitter is sealed.

7. The wireless audio system recited in claim 1 wherein the external selector assembly provides means to externally adjust or control the functions of mute, talkback, and/or power on/off, record or transmit.

8. The wireless audio system recited in claim 7 wherein the wireless microphone transmitter can be programmed to select the function that the external selector assembly is able to adjust or control.

9. The wireless audio system recited in claim 1 wherein the external selector assembly is removably attached to the housing of the wireless microphone transmitter, and the system further comprises an alternative external selector assembly that can be removably attached to the housing of the wireless microphone transmitter.

10. A wireless audio system comprising:

a wireless microphone transmitter adapted to be worn by a performer, said wireless microphone transmitter having a housing, an array of one or more Hall sensors contained within the housing, and a processor; and an external selector assembly, in the form of an external selector assembly, removably attached to the housing of the wireless microphone transmitter including at least one signal magnet that is located external to the housing and is movable relative to the one or more Hall sensors contained within the housing in response to manipulation of the external selector assembly outside of the housing;

wherein each Hall sensor outputs a signal when one of the signal magnets is brought into proximity of the respective Hall sensor, and that signal is received directly or indirectly by said processor on the wireless microphone transmitter; and further wherein the array of Hall sensors consists of two Hall sensors, and the external selector is a toggle switch that has a toggle with a first end that can be moved by a user and a single signal magnet at the other end, and the user can move the toggle so that the signal magnet is in proximity to either Hall sensor.

11. The wireless audio system recited in claim 10 wherein the external selector assembly further includes two detent magnets, each holding the signal magnet on the end of the toggle in the selected active position or repelling the signal magnet to a neutral position.

12. A wireless audio system comprising:

a wireless microphone transmitter adapted to be worn by a performer, said wireless microphone transmitter having a housing, an array of one or more Hall sensors contained within the housing, and a processor; and an external selector assembly, in the form of an external selector assembly, removably attached to the housing of the wireless microphone transmitter including at least one signal magnet that is located external to the housing and is movable relative to the one or more Hall sensors contained within the housing in response to manipulation of the external selector assembly outside of the housing;

wherein each Hall sensor outputs a signal when one of the signal magnets is brought into proximity of the respective Hall sensor, and that signal is received directly or indirectly by said processor on the wireless microphone transmitter; and further wherein the external selector assembly comprises a push-button switch and the array of one or more Hall sensors includes a single Hall sensor for the push button switch.

13. An audio system comprising:

a portable audio device having a housing, an array of one or more Hall sensors contained within the housing, and a processor; and an external selector assembly removably attached to the housing including at least one signal magnet that is located external to the housing and is movable relative to the one or more Hall sensors contained within the housing in response to manipulation of the external selector assembly outside of the housing;

wherein each Hall sensor outputs a signal when one of the signal magnets is brought into proximity of the respective Hall sensor, and that signal is received directly or indirectly by said processor; and wherein the external selector assembly removably attached to the housing of the portable audio device is a spring-loaded bayonet-style switch.

14. The audio system recited in claim 13 wherein the portable audio device is an RF transmitter, an RF receiver, a recorder, a mixer, a mixer-recorder, a fader, a microphone pre-amplifier, a data format converter, a back link communication device, a sound enhancement device, a headphone distribution amplifier, a portable microphone.

15. The audio system recited in claim 13 wherein the spring-loaded bayonet-style switch includes a single signal magnet and two switch positions, the array of one or more Hall sensors contained within the housing consist of a single Hall sensor for the switch, and a locked position of the spring-loaded bayonet-style switch positions the signal magnet within range to activate the single Hall sensor and a free position of the spring-loaded bayonet-style switch positions the signal magnet out of range to activate the single Hall sensor.

16. The wireless audio system recited in claim 13 wherein the portable audio device can be programmed to select the function that the spring-loaded bayonet-style switch is able to adjust or control.

* * * * *